United States Patent
Kubota et al.

(10) Patent No.: US 9,130,168 B2
(45) Date of Patent: Sep. 8, 2015

(54) PIEZOELECTRIC CERAMIC, METHOD FOR MAKING THE SAME, PIEZOELECTRIC ELEMENT, LIQUID DISCHARGE HEAD, AND ULTRASONIC MOTOR

(71) Applicant: CANON KABUSHIKI KAISHA, Tokyo (JP)

(72) Inventors: Makoto Kubota, Yokohama (JP); Tatsuo Furuta, Machida (JP); Hiroshi Saito, Kawasaki (JP); Toshihiro Ifuku, Yokohama (JP); Kenichi Takeda, Yokohama (JP); Tetsuro Fukui, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 17 days.

(21) Appl. No.: 13/853,840

(22) Filed: Mar. 29, 2013

(65) Prior Publication Data
US 2013/0214639 A1 Aug. 22, 2013

Related U.S. Application Data

(62) Division of application No. 12/952,644, filed on Nov. 23, 2010, now Pat. No. 8,846,556.

(30) Foreign Application Priority Data

Nov. 30, 2009 (JP) ................................. 2009-272883

(51) Int. Cl.
*H01L 41/187* (2006.01)
*H01L 41/09* (2006.01)
(Continued)

(52) U.S. Cl.
CPC .......... *H01L 41/1871* (2013.01); *C04B 35/468* (2013.01); *C04B 35/4682* (2013.01); *C04B 35/62655* (2013.01); *C04B 35/62805* (2013.01); *C04B 35/62886* (2013.01); *H01L 41/09* (2013.01); *H01L 41/0973* (2013.01); *H01L 41/43* (2013.01); *H02N 2/106* (2013.01); *H02N 2/163* (2013.01); *C04B 2235/3208* (2013.01); *C04B 2235/3236* (2013.01);
(Continued)

(58) Field of Classification Search
CPC .............................. H01L 41/43; C04B 35/468
USPC ...................... 347/68; 310/311, 358; 264/614; 252/62.9 R, 62.9 PZ; 501/137, 139
See application file for complete search history.

(56) References Cited

U.S. PATENT DOCUMENTS

2002/0151430 A1* 10/2002 Yamaguchi et al. ........... 501/137
2010/0014214 A1 1/2010 Yamazaki et al.

FOREIGN PATENT DOCUMENTS

JP 2008150247 * 7/2008 .............. C04B 35/46
WO 2008/123320 A 10/2008
(Continued)

*Primary Examiner* — Uyen Chau N Le
*Assistant Examiner* — Kajli Prince
(74) *Attorney, Agent, or Firm* — Canon U.S.A. Inc., IP Division

(57) ABSTRACT

A piezoelectric ceramic that includes barium titanate and 0.04 mass % or more and 0.20 mass % or less manganese relative to barium titanate. The piezoelectric ceramic is composed of crystal grains. The crystal grains include crystal grains A having an equivalent circular diameter of 30 μm or more and 300 μm or less and crystal grains B having an equivalent circular diameter of 0.5 μm or more and 3 μm or less. The crystal grains A and the crystal grains B individually form aggregates and the aggregates of the crystal grains A and the aggregates of the crystal grains B form a sea-island structure.

2 Claims, 5 Drawing Sheets

(51) Int. Cl.
  *H01L 41/43* (2013.01)
  *C04B 35/468* (2006.01)
  *C04B 35/626* (2006.01)
  *C04B 35/628* (2006.01)
  *H02N 2/10* (2006.01)
  *H02N 2/16* (2006.01)
(52) U.S. Cl.
  CPC .. *C04B 2235/3262* (2013.01); *C04B 2235/449* (2013.01); *C04B 2235/5445* (2013.01); *C04B 2235/656* (2013.01); *C04B 2235/6567* (2013.01); *C04B 2235/762* (2013.01); *C04B 2235/765* (2013.01); *C04B 2235/77* (2013.01); *C04B 2235/783* (2013.01); *C04B 2235/786* (2013.01); *C04B 2235/96* (2013.01)

(56) References Cited

FOREIGN PATENT DOCUMENTS

| WO | 2008/123320 | A1 | 10/2008 |
| WO | 2008/132928 | A  | 11/2008 |
| WO | 2008/132928 | A1 | 11/2008 |

\* cited by examiner

100 μm

100 μm

100 μm

PIEZOELECTRIC CERAMIC, METHOD FOR MAKING THE SAME, PIEZOELECTRIC ELEMENT, LIQUID DISCHARGE HEAD, AND ULTRASONIC MOTOR

CROSS REFERENCE TO RELATED APPLICATIONS

This application is a Divisional of U.S. patent application Ser. No. 12/952,644 filed Nov. 23, 2010, which claims priority to Japanese Patent Application No. 2009-272883 filed Nov. 30, 2009, both of which are hereby incorporated by reference herein in their entireties.

BACKGROUND OF THE INVENTION

1. Field of the Invention

The present invention relates generally to piezoelectric ceramics, methods for making the piezoelectric ceramics, piezoelectric elements, liquid discharge heads, and ultrasonic motors. In particular it relates to a barium titanate piezoelectric ceramic that has controlled crystal grain size and thereby exhibits good piezoelectric performance and mechanical strength, a method for making the piezoelectric ceramic, a piezoelectric element that uses the piezoelectric ceramic, and a liquid discharge head and an ultrasonic motor that use the liquid discharge element.

2. Description of the Related Art $ABO_3$ perovskite oxides such as lead zirconate titanate (hereinafter referred to as "PZT") are generally used as piezoelectric ceramics.

However, since PZT contains lead as the A-site element, PZT may have an adverse effect on the surrounding environment. Accordingly, piezoelectric ceramics that use lead-free perovskite oxides are sought after.

Barium titanate is known as a lead-free perovskite piezoelectric ceramic material. Japanese Patent Laid-Open No. 2008-150247 discloses barium titanate prepared by a resistance heating/two-step sintering technique. The '247 also discloses that when nano-sized barium titanate powder is sintered by the two-step technique, a ceramic that has a maximum grain diameter of 5 μm or less and good piezoelectric characteristics is obtained.

However, according to the two-step sintering technique, the retention time of the first sintering temperature needs to be short. As a result, the temperature of the ceramic to be sintered becomes inhomogeneous and the piezoelectric characteristics are not always satisfactorily reproduced. For example, the temperature of a barium titanate ceramic piece of a practical size does not become homogeneous if the retention time is about 1 minute. In other words, an ideal nanostructure is not realized in all parts of the sintered ceramics. Thus, there have been no barium titanate ceramics that achieve piezoelectric characteristics sufficient to replace PZT.

The piezoelectric performance of barium titanate may be improved by increasing the crystal grain diameter. Japanese Patent No. 4039029 discloses the relationship between the average grain diameter of a calcium-doped barium titanate ceramics and the piezoelectric constant. The piezoelectric constant ($d_{31}$) is increased when the average grain diameter of the piezoelectric ceramic is increased from 1.3 μm to 60.9 μm.

In Japanese Patent No. 4039029, the average grain diameter of the ceramic is controlled by adjusting the time of wet-mixing of calcined powders. In addition, the average grain diameter of the ceramic is increased by increasing the primary firing temperature.

However, when the average grain diameter of the barium titanate ceramic is increased by the aforementioned techniques, the contact area between the crystal grains is decreased. Thus, the mechanical strength of the ceramic drops and ceramic parts become fragile during processing and driving of the piezoelectric element. In sum, it is desirable that barium titanate piezoelectric ceramics achieve both good piezoelectric characteristics and high mechanical strength.

SUMMARY OF THE INVENTION

It is desirable to provide a piezoelectric ceramic having good piezoelectric characteristics and mechanical strength, a method for making such a piezoelectric ceramic, a piezoelectric element including the piezoelectric ceramic, and a liquid discharge head and an ultrasonic motor including the piezoelectric element.

A first aspect of the present invention provides a piezoelectric ceramic that includes barium titanate and 0.04 mass % or more and 0.20 mass % or less manganese relative to barium titanate. The piezoelectric ceramic is composed of crystal grains. The crystal grains include crystal grains A having an equivalent circular diameter of 30 μm or more and 300 μm or less and crystal grains B having an equivalent circular diameter of 0.5 μm or more and 3 μm or less. The crystal grains A and the crystal grains B individually form aggregates and the aggregates of the crystal grains A and the aggregates of the crystal grains B form a sea-island structure.

A second aspect of the present invention provides a piezoelectric element that includes a first electrode, a piezoelectric ceramic, which is the piezoelectric ceramic described above, and a second electrode.

A third aspect of the present invention provides a liquid discharge head that includes the piezoelectric element described above. A fourth aspect of the present invention provides an ultrasonic motor that includes the piezoelectric element described above.

A fifth aspect of the present invention provides a method for making a piezoelectric ceramic. The method includes sintering a mixture at least containing barium titanate particles 1 containing 0.05 mass % or more and 2.0 mass % or less manganese on a metal basis and barium titanate particles 2 containing less than 0.04 mass % manganese on a metal basis.

The present invention can provide a piezoelectric ceramic having good piezoelectric characteristics and mechanical strength, a method for making such a piezoelectric ceramic, a piezoelectric element including the piezoelectric ceramic, and a liquid discharge head and an ultrasonic motor including the piezoelectric element.

Further features of the present invention will become apparent from the following description of exemplary embodiments (with reference to the attached drawings).

DESCRIPTION OF THE EMBODIMENTS

Figure 1A:
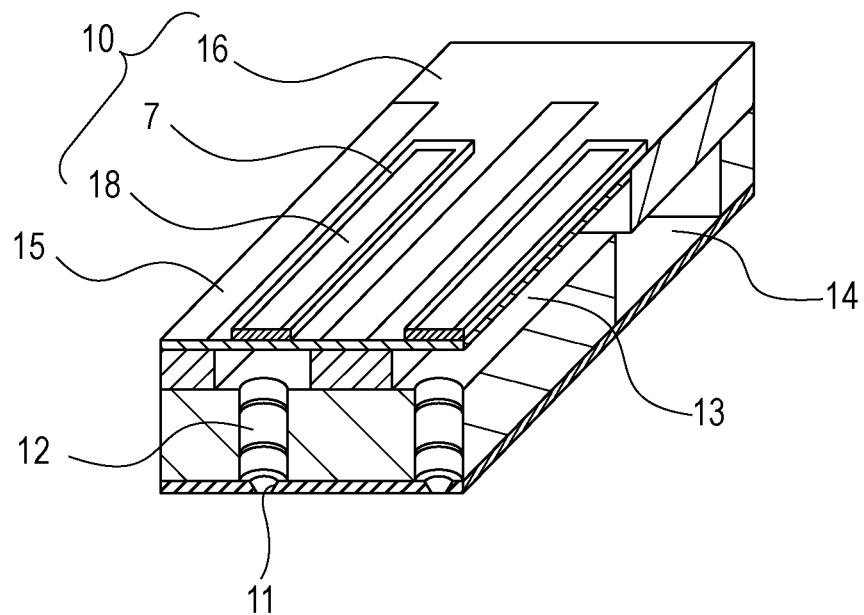
FIGS. 1A and 1B are schematic views showing one embodiment of a liquid discharge head.

The embodiments of the present invention will now be described.

A piezoelectric ceramic according to an embodiment of the present invention contains barium titanate and 0.04 mass % to 0.20 mass % manganese relative to barium titanate. The piezoelectric ceramic is constituted by crystal grains. The crystal grains contain crystal grains A having an equivalent circular diameter of 30 µm or more and 300 µm or less and crystal grains B having an equivalent circular diameter of 0.5 µm or more and 3 µm or less. The crystal grains A and the crystal grains B individually form aggregates. The aggregates of the crystal grains A and the aggregates of the crystal grains B form a sea-island structure.

In the present invention, a "ceramic" means an aggregated body (also referred to as "bulk") of crystal grains sintered by heat treatment, i.e., a polycrystal, and includes those subjected to processing after sintering. However, powder and slurry containing dispersed powder are excluded from the meaning.

The main component of the piezoelectric ceramic is barium titanate. Barium titanate may be $ABO_3$ perovskite crystals such as those represented by general formula $BaTiO_3$.

The meaning of the "main component" is that the component primarily responsible for exhibiting the piezoelectric characteristics is barium titanate. For example, piezoelectric ceramic may contain a component, such as manganese, for adjusting characteristics and production-induced unavoidable impurities.

In particular, the barium titanate content in the piezoelectric ceramic is 95 mass % or more, preferably 97 mass % or more, and more preferably 99 mass % or more and 99.96 mass % or less. The components contained in the piezoelectric ceramic other than barium titanate may be contained in an amount of less than 5 mass %. When the components that do not contribute to the piezoelectric characteristics are contained in an amount exceeding 5 mass %, the piezoelectricity of the piezoelectric ceramic as a whole may become insufficient.

The barium (Ba) sites of barium titanate may be partly substituted with another divalent metal or a pseudo-divalent metal. Examples of the divalent metal that substitutes the Ba sites include calcium (Ca) and strontium (Sr). Examples of the pseudo-divalent metal that substitutes the Ba sites include $(Bi_{0.5}Na_{0.5})$, $(Bi_{0.5}K_{0.5})$, $(Bi_{0.5}Li_{0.5})$, $(La_{0.5}Na_{0.5})$, $(La_{0.5}K_{0.5})$, and $(La_{0.5}Li_{0.5})$. The substitution rate of partially substituting the Ba sites with another divalent metal or a pseudo-divalent metal is 20 atm % or less and preferably 10 atm % or less. When the substitution rate exceeds 20 atm %, high piezoelectric characteristics unique to barium titanate may not be satisfactorily obtained.

Titanium (Ti) sites of barium titanate may be partly substituted with another tetravalent metal or a pseudo-tetravalent metal. Examples of the tetravalent metal that substitutes the Ti sites include zirconium (Zr), hafnium (Hf), silicon (Si), tin (Sn), and germanium (Ge). Examples of the pseudo-tetravalent metal that substitutes the Ti sites include combinations of divalent metals and pentavalent metals $(M^{2+}_{1/3}M^{5+}_{2/3})$, combinations of trivalent metals and pentavalent metals $(M^{3+}_{1/2}M^{5+}_{1/2})$, and combinations of trivalent metals and hexavalent metals $(M^{3+}_{2/3}M^{6+}_{1/3})$.

The piezoelectric ceramic contains 0.04 mass % or more and 0.20 mass % or less and preferably 0.05 mass % or more and 0.17 mass % or less manganese relative to the barium titanate component. Manganese is not limited to metallic manganese. Manganese may take any form as long as it is contained as the manganese component in the piezoelectric ceramic. For example, manganese may be solid-dissolved in barium titanate. Manganese contained in the piezoelectric ceramic may be in a metallic form, an ionic form, an oxide form, a metal salt form, a complex form, etc. When a piezoelectric ceramic containing barium titanate as a main component contains a manganese component in an amount within the aforementioned range, the insulating property and the mechanical quality factor (Qm) are improved. The effect brought about by addition of manganese does not occur if the manganese content is less than 0.04 mass %. When the manganese content exceeds 0.20 mass %, the piezoelectricity of the piezoelectric ceramic as a whole may become insufficient due to mixing-in of hexagonal barium titanate having low piezoelectricity.

Crystal grains of the piezoelectric ceramic contain barium titanate and manganese. The crystal grains include crystal grains A having an equivalent circular diameter of 30 µm or more and 300 µm or less and crystal grains B having an equivalent circular diameter of 0.5 µm or more and 3 µm or less. The crystal grains A and the crystal grains B individually form aggregates. The aggregates of the crystal grains A and the aggregates of the crystal grains B form a sea-island structure.

The crystal grains A having an equivalent circular diameter of 30 µm or more and 300 µm or less improve the piezoelectric performance of the piezoelectric ceramic. The crystal grains B having an equivalent circular diameter of 0.5 µm or more and 3 µm or less form aggregates and enter into gaps between the crystal grains A to increase the packing property, thereby increasing the mechanical strength of the piezoelectric ceramic.

If the ceramic contains aggregates of crystal grains A only, the contact area between the crystal grains decreases and the mechanical strength is thereby decreased. The decrease in mechanical strength tends to cause cracking and breaking of the ceramic when the ceramic is used in a piezoelectric element. In contrast, if the ceramic contains aggregates of crystal grains B only, the degree of piezoelectricity becomes insufficient. Moreover, since there is no structure that serves as a core, the mechanical strength also tends to be slightly insufficient.

In this invention, the "equivalent circular diameter" means the diameter of a circle with an area equal to that of a projection of the crystal grain onto a plane, i.e., the diameter generally known as a "projected area equivalent diameter" in microscopy. The crystal grains are classified into crystal grains A, crystal grains B, and crystal grains C on an equivalent circular diameter basis. The method for measuring the equivalent circular diameter is not particularly limited. For example, the equivalent circular diameter can be measured by performing image-processing on a photographic image of a surface of a piezoelectric ceramic taken by a polarizing microscope or a scanning electron microscope. The magnification used in obtaining the equivalent circular diameter of the crystal grains A is, for example, about 5 to 50. The magnification used in obtaining the equivalent circular diameter of the crystal grains B is, for example, about 500 to 5000. Either an optical microscope or an electron microscope may be used depending on the magnification. The equivalent circular diameter may be determined from an image of a polished surface or a cross section instead of the surface of the ceramic.

In this invention, the "sea-island structure" refers to a state of phase separation in a solid. In other words, when solid matter is roughly composed of two kinds of substances, a substance (regarded as "islands") may be mixed with and exist in a discontinuous manner within a substance (regarded as "sea") that appears to be relatively continuous. The "sea-island structure" refers to such a state. In particular, aggregates of crystal grains A and aggregates of crystal grains B serve as a sea and islands or vice versa. When the aggregates of crystal grains A and aggregates of crystal grains B are not separated from each other and remain mixed with each other, piezoelectricity and mechanical strength can be obtained for the piezoelectric ceramic.

The crystal grains A and crystal grains B may contain barium titanate having the same non-centrosymmetric crystal structure to enhance the piezoelectric performance of the piezoelectric ceramic. Otherwise, the piezoelectric performance significantly degrade. Crystal grains that have a centrosymmetric crystal structure do not exhibit piezoelectricity.

Examples of the non-centrosymmetric crystal structure include tetragonal, rhombohedral, monoclinic, and orthorhombic systems. An example of the centrosymmetric crystal structure is a cubic system. Of the non-centrosymmetric crystal structures described above, the tetragonal system is most preferred. When both the crystal grains A and crystal grains B have a tetragonal crystal structure, the piezoelectric performance of the piezoelectric ceramic are improved. When the composition and the crystal structure of the crystal grains A are substantially the same as those of the crystal grains B, the c/a ratio, i.e., a parameter indicating the tetragonality of crystals, also displays similar values. The c/a ratio suitable for the piezoelectric ceramic having a tetragonal crystal structure is 1.005 or more and 1.025 or less.

The aggregates of the crystal grains B may form the island portions of the sea-island structure. When crystal grains A having high piezoelectricity and rigidity serve as the sea so as to constitute the aggregates of the piezoelectric ceramic, and aggregates of crystal grains B having high shape flexibility serve as the islands, the piezoelectric performance and the mechanical strength of the piezoelectric ceramic as a whole are improved.

The piezoelectric ceramic may contain crystal grains C that do not satisfy the conditions set for the equivalent circular diameters of the crystal grains A and B. Examples of such grains include crystal grains having an equivalent circular diameter exceeding 300 μm, fine crystal grains having an equivalent circular diameter less than 0.5 μm, and small crystal grains having an equivalent circular diameter of more than 3 μm and less than 30 μm. Such crystal grains are referred to as "crystal grains C". The percentage of area occupied by the crystal grains C determined by observation of a surface or cross-section of the piezoelectric ceramic is preferably 10 area % or less and more preferably 5 area % or less. If more than 10 area % of crystal grains C exist, the piezoelectricity-improving effect brought about by the crystal grains A and the mechanical property-improving effect brought about by the crystal grains B may be degraded.

The percentage of the area occupied by the crystal grains A determined by observation of a surface or cross-section of the piezoelectric ceramic is preferably 40 area % or more and 86 area % or less and more preferably 51 area % or more and 85 area % or less, and yet more preferably 73 area % or more and 85 area % or less. When the area occupied by the crystal grains A is within the above described range, the piezoelectric performance of the piezoelectric ceramic are improved. When the percentage of the crystal grains A is less than 40 area %, a high piezoelectric constant is not expected. In contrast, when the percentage of the crystal grains A is more than 86 area %, excessively large gaps are generated which may not be filled with the crystal grains B. As a result, the mechanical characteristics of the piezoelectric ceramic are degraded. In particular, the piezoelectric ceramic shows a tendency to crack.

The percentage of the area occupied by the aggregates of the crystal grains B determined by observation of a surface or cross-section of the piezoelectric ceramic is 14 area % or more and 60 area % or less and preferably 15 area % or more and 49 area % or less. The area occupied by the aggregates of the crystal grains B includes the crystal grains B and grain boundaries of the crystal grains B. In particular, the area occupied by the aggregates of the crystal grains B is determined by subtracting the areas of the crystal grains A, crystal grains C, and missing portions from the observed view. When the percentage of area occupied by the aggregates of the crystal grains B is less than 14 area %, the mechanical strength of the piezoelectric ceramic may be deficient. When the percentage exceeds 60 area %, the piezoelectric ceramic is not expected to exhibit a high piezoelectric constant.

The crystal grains A and B of the piezoelectric ceramic both contain barium titanate as a main component and preferably contain 0.04 mass % to 0.20 mass % and more preferably 0.05 mass % to 0.17 mass % manganese relative to barium titanate. Since the crystal grains contain manganese in this range, the mechanical quality factor (Qm) of the piezoelectric ceramic is further increased and deterioration caused by depolarization is suppressed.

A method for making the piezoelectric ceramic will now be described.

A method for making the piezoelectric ceramic includes a step of sintering a mixture of barium titanate particles 1 containing 0.05 mass % to 2.0 mass % (metal basis) manganese and barium titanate particles 2 containing less than 0.04 mass % (metal basis) manganese. Hereinafter, the two types of barium titanate particles are distinguished from each other by naming them "barium titanate particles 1" and "barium titanate particles 2". The barium titanate particles 1 are abbreviated as BT-1 particles and the barium titanate particles 2 are abbreviated as BT-2 particles.

The BT-1 particles are barium titanate particles containing 0.05 mass % to 2.0 mass % manganese on a metal basis. The manganese content in the BT-2 particles is less than 0.04 mass % on a metal basis. The BT-2 particles may be free of manganese.

Manganese may be combined with the BT-1 particles and BT-2 particles in any form. For example, manganese may be solid-dissolved in barium titanate particles. Manganese may be caused to adhere to barium titanate particles by taking an elemental metal form, an ion form, an oxide form, a metal salt form, a complex form, etc.

The BT-1 particles and BT-2 particles may contain barium titanate, a component for adjusting characteristics other than manganese, and production-derived impurities. Examples of the impurities include metal-derived components such as aluminum, calcium, niobium, iron, and lead, glass components, and hydrocarbon-based organic components. The impurity content is preferably 5 mass % or less and more preferably 1 mass % or less.

The particle diameter of the BT-1 and BT-2 particles as primary particles is not particularly limited. However, the primary particle diameter is preferably 5 nm to 300 nm and more preferably 50 nm to 150 nm to obtain a high-density homogeneous piezoelectric ceramic. The density of the ceramic after sintering may become deficient if the primary particle diameter is excessively large or small. Here, "primary particles" mean individual particles of the minimum unit that can be clearly separated from the rest of the particles constituting the powder. The primary particles may be agglomerated to form larger secondary particles. Secondary particles may be intentionally produced by performing an agglomeration step using a polymeric binder.

The method for making the BT-1 and BT-2 particles is not particularly limited. In order to form manganese-clad barium titanate, a manganese component may be added to commercially available or synthetic barium titanate particles during a post process. The method for adding the manganese component is not particularly limited but the manganese component are preferably uniformly adhered on the surface of barium titanate particles. From this viewpoint, a spray drying method is the most preferable method for adding the manganese component.

In order to form barium titanate in which manganese is dissolved, a barium titanate precursor already containing a manganese component may be crystallized to form the BT-1 and BT-2 particles. For example, an equimolar mixture of a barium compound and a titanium compound may be mixed with a desired amount of a manganese component and the resulting mixture may be calcined at about 1000° C. to obtain manganese-dissolved barium titanate particles.

Examples of the barium compound that can be used in making the BT-1 and BT-2 particles include barium carbonate, barium oxalate, barium oxide, barium aluminate, and various barium alkoxides.

Examples of the titanium compound that can be used in making the BT-1 and BT-2 particles include titanium oxide. Examples of the manganese component that can be used in making the BT-1 and BT-2 particles include manganese compounds such as manganese oxide, manganese dioxide, and manganese acetate.

The BT-1 particles differ from the BT-2 particles in the manganese content. When barium titanate contains manganese, the rate of generating crystal growth nuclei during sintering is lowered. This tendency is more apparent when manganese is adhered on the particle surfaces than when manganese is dissolved in the particles.

When BT-1 particles and BT-2 particles are mixed and fired, portions in which crystal nuclei are dense and portions in which crystal growth nuclei are sparse are formed inside the ceramic undergoing sintering since the crystal nucleation rate differs between the BT-1 particles and BT-2 particles. Due to uneven distribution of the nuclei, the sintered ceramic will include crystal grains with large diameters derived from the portions where the nuclei had been sparse and crystal grains with small diameters derived from the portions where the nuclei had been dense. Crystal grains with large diameters contribute to improving the piezoelectricity of the ceramic. The crystal grains with small diameters contribute to enhancing the mechanical strength of the ceramic since the contact area between the crystal grains is increased.

In the step of mixing the BT-1 particles and the BT-2 particles, the ratio of the BT-1 particles is 2 mass % or more and 90 mass % or less and preferably 5 mass % or more and 90 mass % or less. When the ratio of the BT-1 particles is less than 2 mass %, the piezoelectric performance of the sintered ceramic may be degraded. In contrast, when the ratio of the BT-1 particles exceeds 90 mass %, the mechanical characteristics of the sintered ceramic may be lowered.

In the step of mixing the BT-1 particles and the BT-2 particles, the ratio of the BT-2 particles is 10 mass % or more and 98 mass % or less and preferably 10 mass % or more and 95 mass % or less. The method for mixing the particles is not particularly limited. The particles may be mixed in a solid state using a mortar or in a liquid phase dispersed state using a ball mill or a bead mill.

The resulting barium titanate particle mixture is molded into a desired shape and sintered into a ceramic. The method for sintering the ceramic is not particularly limited. Examples of the sintering method include a sintering method using an electric furnace, an electric heating method, a microwave sintering method, a millimeter-wave sintering method, and a hot isostatic pressing (HIP) method.

The sintering temperature of the ceramic is not particularly limited and may be a temperature at which crystals of barium titanate grow sufficiently. The sintering temperature is preferably 1000° C. or more and 1450° C. or less and more preferably 1300° C. or more and 1400° C. or less. The barium titanate ceramic sintered in this temperature range shows good piezoelectric characteristics.

In order to stabilize characteristics of the piezoelectric ceramic obtained by sintering with good reproducibility, sintering may be performed for about 1 hour more and 12 hours or less by retaining the sintering temperature constant in the above-described temperature range.

A piezoelectric element that uses the piezoelectric ceramic will now be described.

A piezoelectric element includes a first electrode, a piezoelectric ceramic, which is the piezoelectric ceramic described above, and a second electrode.

The first electrode and the second electrode are each formed of a conductive layer having a thickness of about 5 nm to 2000 nm. The material for the electrodes is not particularly limited and any material generally used in piezoelectric elements may be used. Examples of the material include metals such as Ti, Pt, Ta, Ir, Sr, In, Sn, Au, Al, Fe, Cr, Ni, Pd, Cu, and Ag and oxides thereof. The first electrode and the second electrode may be composed of one of these materials or may be a laminate of two or more of these materials. The first electrode may be composed of a material different from that of the second electrode.

The method for making the first electrode and the second electrode is not particularly limited. The electrodes may be formed by baking a metal paste, sputtering, or vapor deposition. The first electrode and the second electrode may be patterned into desired shapes.

Figure 1B:
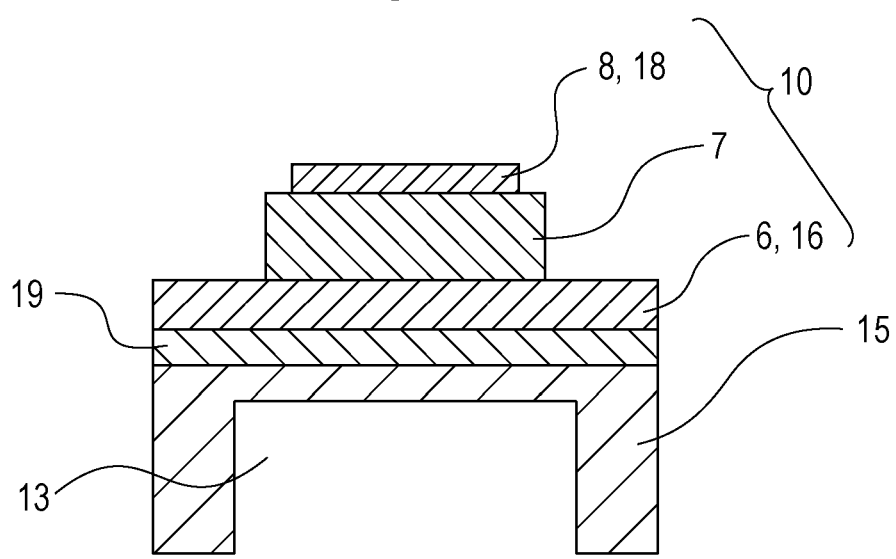

FIGS. 1A and 1B are schematic views showing one embodiment of a liquid discharge head. As shown in FIG. 1B, the piezoelectric element includes a first electrode 6, a piezoelectric ceramic 7, and a second electrode 8.

The liquid discharge head includes the piezoelectric element described above. FIG. 1A is a schematic view of the liquid discharge head. The liquid discharge head includes a discharge port 11, a connecting hole 12 that connects an individual liquid reservoir 13 to the discharge port 11, a common liquid reservoir 14, a diaphragm 15, and a piezoelectric element 10. The piezoelectric element 10 has a rectangular shape as shown in the drawing but may have an elliptic shape, a circular shape, a parallelogram shape, or the like. In general, the piezoelectric ceramic 7 is formed into a shape that reflects the shape of the individual liquid reservoir.

The piezoelectric element 10 of the liquid discharge head and components near the piezoelectric element 10 will now be described in detail with reference to FIG. 1B. FIG. 1B is a cross-sectional view of the piezoelectric element taken in the width direction of the liquid discharge head shown in FIG. 1A. Although the cross-sectional shape of the piezoelectric element 10 is rectangular in the drawing, the shape may be trapezoidal or inverted trapezoidal. In the drawing, the first electrode 6 corresponds to a lower electrode 16 and the second electrode 8 corresponds to an upper electrode 18. However, the first electrode 6 may function as the lower electrode 16 or the upper electrode 18, and the second electrode 8 may also function as the lower electrode 16 or the upper electrode 18. A buffer layer 19 may be provided between the diaphragm 15 and the lower electrode 16.

The diaphragm 15 moves vertically as the piezoelectric ceramic expands and contracts, thereby applying pressure to the liquid in the individual liquid reservoir and causing the liquid discharge head to discharge the liquid through the discharge port. The liquid discharge head can be used in printers and for making electronic devices.

The thickness of the diaphragm 15 is 1.0 μm or more and 15 μm or less and preferably 1.5 μm or more and 8 μm or less. The material for the diaphragm 15 is not particularly limited but may be silicon. The buffer layer and the electrode layer on silicon may constitute part of the diaphragm 15. Silicon in the diaphragm 15 may be doped with boron (B) or phosphorus (P).

The thickness of the buffer layer 19 is 300 nm or less and preferably 200 nm or less. The size of the discharge port 11 is preferably 5 μm or more and 40 μm or less in diameter. The discharge port 11 has a circular shape in the drawing but may have a star shape, a rectangular shape, or a triangular shape.

Figure 2A:
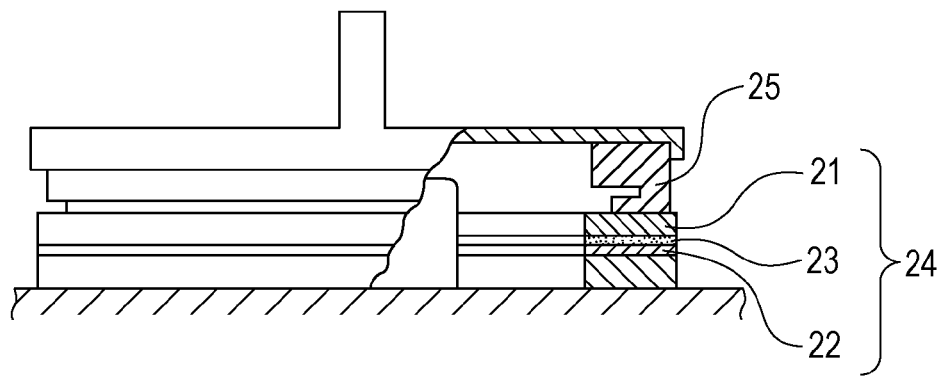
FIGS. 2A and 2B are schematic views showing embodiments of ultrasonic motors.
Figure 2B:
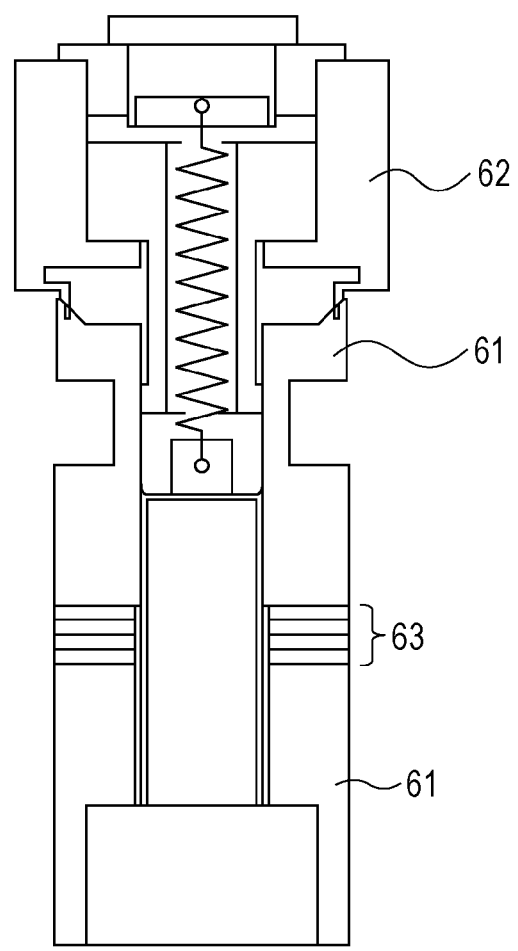

An ultrasonic motor that uses the piezoelectric element will now be described. FIGS. 2A and 2B are schematic views showing embodiments of ultrasonic motors.

FIG. 2A shows an ultrasonic motor including a single plate-type piezoelectric element. The ultrasonic motor includes a transducer 24 prepared by bonding a piezoelectric element 22 onto a metal elastic ring 21 with an organic adhesive 23 (epoxy adhesive, cyanoacrylate adhesive, or the like), a rotor 25 is pressed against a sliding surface of the transducer 24 by a pressure spring (not shown in the drawing), and an output shaft that is integral with the rotor 25.

When an AC voltage is applied from a two-phase power source (phases differ by π/2) to the piezoelectric element, flexural progressive waves are generated in the transducer 24 and individual points in the sliding surface of the transducer 24 undergo elliptical motion. When the rotor 25 is pressed against the sliding surface of this transducer 24, the rotor 25 receives frictional force from the transducer 24 and rotates in the direction of the elliptical motion on the sliding surface of the transducer 24. An object to be driven (not shown in the drawing) is joined to the output shaft by coupling or the like, and driven by the turning force of the rotor 25. When a voltage is applied to a piezoelectric ceramic, the piezoelectric element expands and contracts due to a transversal piezoelectric effect and thus an elastic body, such as metal, joined to the piezoelectric element is bent. This principle is utilized by motors of the above-described type.

FIG. 2B shows an ultrasonic motor including a multilayered piezoelectric element. The ultrasonic motor includes a transducer 61 composed of a metal material. A plurality of piezoelectric elements 63 are interposed between cylindrical metal blocks and the metal blocks are fastened with bolts to hold the piezoelectric elements 63 therebetween, thereby constituting the transducer 61. The transducer 61 excites two types of vibrations orthogonally intersecting each other when AC voltages having different phases are applied to the driving piezoelectric ceramic of the piezoelectric element. When two vibrations are combined, the tip of the transducer 61 produces a circular vibration used for driving. A circumferential groove is formed in the upper part of the transducer 61 to increase the displacement of the vibration for driving.

The ultrasonic rotor further includes a rotor 62 pressed against the transducer 61 by a pressure spring so that frictional force for driving is obtained.

As previously discussed, the piezoelectric element according to embodiments of the present invention is suitable for use in a liquid discharge head and an ultrasonic motor. When a lead-free piezoelectric element mainly composed of barium titanate is included in a liquid discharge head, a head having a nozzle density and discharge power comparable or superior to those of heads using lead-based piezoelectric elements can be obtained. When a lead-free piezoelectric element mainly composed of barium titanate is included in an ultrasonic motor, a motor having driving force and durability comparable or superior to those of motors using lead-based piezoelectric elements can be obtained.

The piezoelectric ceramic according to embodiments of the present invention can be used not only in a liquid discharge head and a motor, but also in devices such as an ultrasonic vibrator, a piezoelectric actuator, and a piezoelectric sensor.

EXAMPLES

The present invention will now be described in further specific detail below by using Examples. It should be understood that these examples do not limit the scope of the present invention.

Production Example 1

Production of Manganese-Containing Barium Titanate Particles (Raw Material Powder 1A)

Manganese(II) acetate was allowed to adhere on surfaces of barium titanate particles having an average particle diameter of 100 nm (trade name BT-01, product of Sakai Chemical Industry Co., Ltd.) by using a spray drier. The manganese content in the resulting powder was 0.80 mass % according to inductively coupled plasma mass spectrometry (ICP-MS). The manganese content was adjustable by controlling the ratio of the raw material fed to the spray drier. The resulting powder corresponds to the barium titanate particles 1 described above and is referred to as "raw material powder 1A" hereinafter.

Production Example 2

Production of Manganese-Containing Barium Titanate Particles (Raw Material Powder 2B)

Barium titanate particles having a manganese content of 0.03 mass % were produced as in Production Example 1 except that the feed ratio of manganese(II) acetate was changed. The resulting powder corresponds to the barium titanate particles 2 described above and is referred to as "raw material powder 2B" hereinafter.

Production Example 3

Production of Manganese-Containing Barium Titanate Particles (Raw Material Powder 1C)

Barium titanate particles having a manganese content of 0.18 mass % were produced as in Production Example 1 except that the raw material for manganese was changed to manganese(II) oxide and its feed ratio was adjusted. The resulting powder corresponds to the barium titanate particles 1 described above and is referred to as "raw material powder 1C" hereinafter.

Production Example 4

Production of Manganese-Free Barium Titanate Particles (Raw Material Powder 2D)

Barium titanate particles having an average particle diameter of 100 nm (trade name BT-01, product of Sakai Chemical Industry Co., Ltd.) were dried in an electric furnace at 250° C. for 3 hours. The resulting powder corresponds to the barium titanate particles 2 described above and is referred to as "raw material powder 2D" hereinafter.

Production Example 5

Production of Barium Titanate Particles Containing Manganese and Calcium (Raw Material Powder 1E)

Barium titanate particles having an average particle diameter of 100 nm (trade name BT-01, product of Sakai Chemical Industry Co., Ltd.) and calcium titanate having an average particle diameter of 300 nm (trade name CT-03, product of Sakai Chemical Industry Co., Ltd.) were mixed with each other at a BT-01/CT-03 ratio of 9:1 on a molar basis in a ball mill for 24 hours. As in Production Example 3, manganese(II) oxide was caused to adhere on particle surfaces of the mixed powder to obtain barium calcium titanate particles having a manganese content of 0.18 mass %. This powder corresponds to the barium titanate particles 1 described above and is referred to as "raw material powder 1E" hereinafter.

Production Example 6

Production of Barium Titanate Particles Containing Calcium but not Manganese (Raw Material Powder 2F)

Barium titanate particles having an average particle diameter of 100 nm (trade name BT-01, product of Sakai Chemical Industry Co., Ltd.) and calcium titanate having an average particle diameter of 300 nm (trade name CT-03, product of Sakai Chemical Industry Co., Ltd.) were mixed with each other at a BT-01/CT-03 ratio of 9:1 on a molar basis in a ball mill for 24 hours. The resulting mixed powder was dried in an electric furnace at 250° C. for 3 hours. The resulting powder corresponds to the barium titanate particles 2 described above and is referred to as "raw material powder 2F" hereinafter.

Examples 1 to 7

Table 1 shows production conditions of piezoelectric ceramics of Examples 1 to 7.

TABLE 1

| | Type of Particles 1 | Type of Particles 2 | Mass ratio (Particles 1/ Particles 2) | Sintering temperature (° C.) | Sintering time (Hr) |
|---|---|---|---|---|---|
| Example 1 | 1C | 2B | 65/35 | 1360 | 5 |
| Example 2 | 1C | 2D | 90/10 | 1340 | 5 |
| Example 3 | 1C | 2B | 10/90 | 1380 | 5 |
| Example 4 | 1C | 2D | 50/50 | 1280 | 5 |
| Example 5 | 1A | 2B | 30/70 | 1420 | 5 |
| Example 6 | 1A | 2D | 5/95 | 1300 | 5 |
| Example 7 | 1E | 2F | 80/20 | 1450 | 8 |
| Comparative Example 1 | 1C | None | 100/0 | 1400 | 5 |
| Comparative Example 2 | 1C | None | 100/0 | 1300 | 5 |
| Comparative Example 3 | 1C | None | 100/0 | 1150 | 5 |
| Comparative Example 4 | None | 2D | 0/100 | 1150 | 15 |

Two types of barium titanate particles were weighed according to the mass ratio indicated in Table 1 and mixed in a mortar. A polyvinyl alcohol binder was added to the mixed powder and the resulting mixture was agglomerated. The agglomerated powder was placed in a die and compressed to form a compact. The compact was baked for 5 hours or 8 hours at a sintering temperature indicated in Table 1. The firing atmosphere was air. The heating rate was 10° C./min. The thermocouple of the electric furnace was adjusted to prevent an overshoot exceeding the sintering temperature by 10° C. or more. Thus, a piezoelectric ceramic was made.

Table 2 shows analytic data regarding the composition, structure, and characteristics of the piezoelectric ceramic obtained thereby.

TABLE 2

| | Crystal grain A (area %) | Sea-island structure | Crystal grains C (area %) | Crystal structure of crystal grains B | Aggregates of crystal grains B (area %) | Mn content in A (mass %) | Mn content in B (mass %) | Piezoelectric constant $d_{31}$ (pm/V) | Maximum stress (MPa) |
|---|---|---|---|---|---|---|---|---|---|
| Example 1 | 73 | Island: B | 2 | Tetragonal | 25 | 0.12 | 0.12 | −150 | 65 |
| Example 2 | 85 | Island: B | 0 | Tetragonal | 15 | 0.17 | 0.17 | −155 | 56 |
| Example 3 | 40 | Island: B | 11 | Tetragonal | 49 | 0.05 | 0.05 | −125 | 49 |
| Example 4 | 69 | Island: B | 4 | Tetragonal | 27 | 0.17 | 0.02 | −115 | 55 |
| Example 5 | 83 | Island: B | 0 | Cubic | 17 | 0.20 | 0.20 | −110 | 57 |
| Example 6 | 29 | Island: A | 6 | Tetragonal | 65 | 0.04 | 0.04 | −100 | 46 |
| Example 7 | 82 | Island: B | 0 | Tetragonal | 18 | 0.16 | 0.16 | −105 | 53 |
| Comparative Example 1 | 100 | Not sea-island | 0 | None | 0 | 0.16 | None | −95 | 2 |
| Comparative Example 2 | 0 | Not sea-island | 95 | Tetragonal | 5 | None | 0.18 | −85 | 25 |
| Comparative Example 3 | 0 | Not sea-island | 2 | Cubic | 98 | None | 0.18 | 0 | 20 |
| Comparative Example 4 | 0 | Not sea-island | 90 | Tetragonal | 10 | None | 0 | −75 | 35 |

Each sintered body obtained as above was polished into a disk-shaped piece having a thickness of 1 mm to conduct X-ray diffractometry (XRD), X-ray fluorescence analysis (XRF), and Archimedean density measurement. Although not indicated in Table 2, all piezoelectric ceramics were composed of a perovskite single phase mainly composed of barium titanate. All piezoelectric ceramics exhibited a high density of 95% or more with respect to the theoretical density of barium titanate. The piezoelectric ceramic of Example 7 exhibited a high density of 95% or more with respect to the theoretical density of $(Ba_{0.9}Ca_{0.1})TiO_3$.

The state of crystal grains of the piezoelectric ceramics was observed mainly with a polarizing microscope. A scanning electron microscope (SEM) was used in determining the diameter of small crystal grains. Observation was conducted on a surface of the ceramic after sintering and a surface of the ceramic after polishing. The size and conditions of the crystal grains were not significantly different between the two surfaces. Thus, while Table 2 indicates data of the surface after sintering as representative examples, the same tendencies are observed in sections formed by polishing.

Figure 3A:
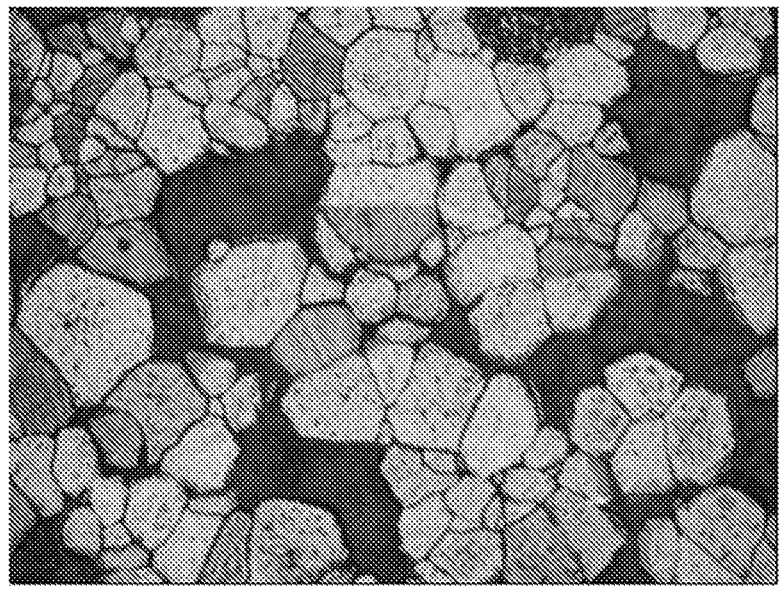
FIGS. 3A and 3B are polarizing microscope images of a surface of a piezoelectric ceramic of Example 1.

FIGS. 3A to 5B show examples of polarizing microscope images taken during the above-described microscopic observation. FIG. 3A is an enlarged photograph of a surface of a piezoelectric ceramic of Example 1 taken with the polarizing microscope and FIG. 3B is an image obtained by performing image-processing on the photograph shown in FIG. 3A.

Figure 4A:
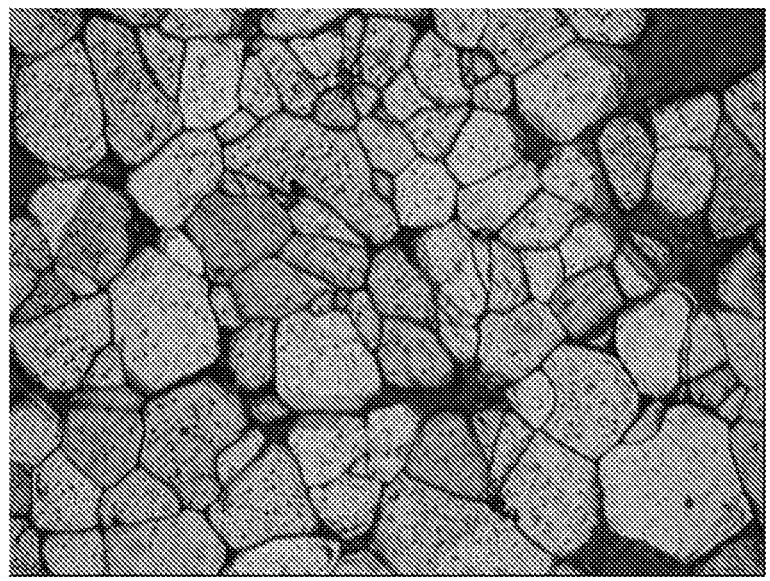
FIGS. 4A and 4B are polarizing microscope images of a surface of a piezoelectric ceramic of Example 2.
Figure 4B:
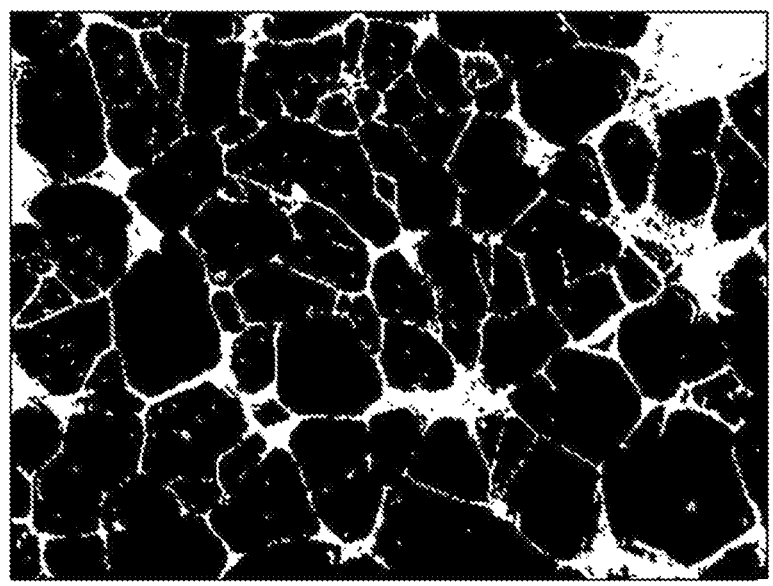

FIG. 4A is an enlarged photograph of a surface of a piezoelectric ceramic of Example 2 taken with the polarizing microscope and FIG. 4B is an image obtained by performing image-processing on the photograph shown in FIG. 4A.

Figure 5A:
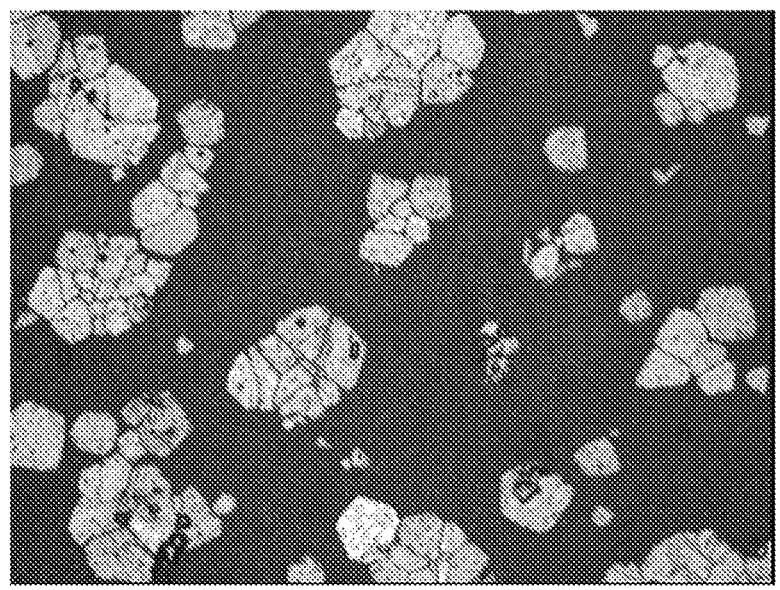
FIGS. 5A and 5B are polarizing microscope images of a surface of a piezoelectric ceramic of Example 6.
Figure 5B:
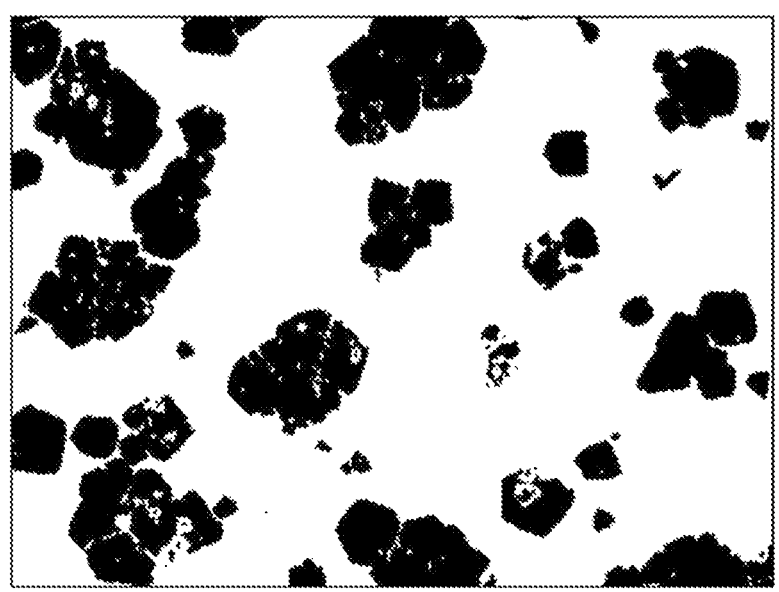

FIG. 5A is an enlarged photograph of a surface of a piezoelectric ceramic of Example 6 taken with the polarizing microscope and FIG. 5B is an image obtained by performing image-processing on the photograph shown in FIG. 5A.

The presence of crystal grains A, B, and C and the state of the crystal grains were confirmed from these images. All piezoelectric ceramics of Examples had crystal grains A and crystal grains B, and aggregates of the crystal grains A and B formed a sea-island structure.

For example, in the piezoelectric ceramic of Example 1 shown in FIG. 3A, large crystal grains indicated by a light color substantially have an equivalent circular diameter of 30 μm or more and 300 μm or less and thus satisfy the conditions of the crystal grains A. These crystal grains A are aggregated with each other and form single continuous structure at least in the region shown in the photograph. This is the state of "sea".

FIG. 3A also shows dark regions that lie in gaps in the "sea". These regions were enlarged and observed. The regions were composed of relatively small crystal grains that had an equivalent circular diameter of about 0.5 μm to 3 μm and thus satisfied the conditions of crystal grains B. The crystal grains B are aggregated with each other and found in dispersed positions so as fill the spaces between the aggregates of the crystal grains A. This is the state of "island".

Trace amounts of crystal grains that satisfy the conditions of the crystal grains C were also observed. In all examples, large crystal grains having an equivalent circular diameter exceeding 300 μm and fine crystal grains having an equivalent circular diameter less than 0.5 μm were not observed.

Figure 3B:
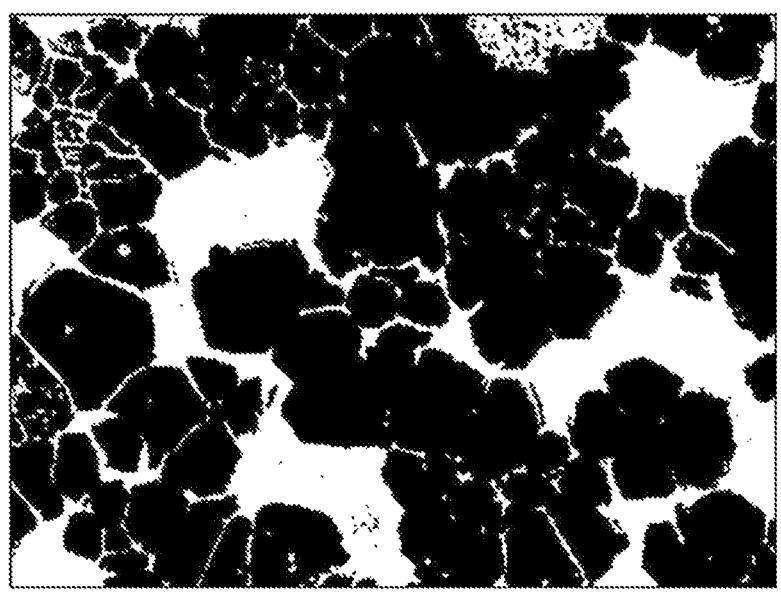

The image shown in FIG. 3B was obtained by binalizing the microscope photograph shown in FIG. 3A by image processing. The portions that satisfy conditions of the crystal grains A are indicated in black and other portions are indicated in white. Other photographs were processed in the same manner and analyzed to determine the percentage of the area occupied by the crystal grains A. The results are indicated in Table 2. The percentage of the area occupied by the crystal grains C was also calculated by changing the threshold of the image processing. The percentage of the remaining area other than those occupied by the crystal grains A and C is the percentage of the area occupied by the aggregates of the crystal grains B, i.e., the crystal grains B and crystal boundaries.

The crystal structures of the crystal grains A and B were determined with X-ray micro beam diffractometer (product of Bruker AXS) for evaluating thin film materials. The beam diameter was 100 μm and 2θ/θ measurement was conducted by irradiating either an aggregate of the crystal grains A or an aggregate of the crystal grains B with this beam. As a result, it was found that, in the piezoelectric ceramics of all Examples, the crystal grains A had tetragonal structures with c/a of about 1.02. The crystal structure of the crystal grains B is as indicated in Table 2.

The manganese contents in the crystal grains A and crystal grains B were determined by electron energy loss spectroscopy (EELS) with a transmission electron microscope (TEM). The results are indicated in Table 2.

The manganese content in the entire piezoelectric ceramic was determined with an X-ray fluorescent analyzer (product of PANalytical) by wavelength dispersive XRF. The manganese contents relative to the barium titanate component determined as such were as follows:
Example 1: 0.12 mass %
Example 2: 0.17 mass %
Example 3: 0.04 mass %
Example 4: 0.14 mass %
Example 5: 0.20 mass %
Example 6: 0.04 mass %
Example 7: 0.16 mass %

Comparative Examples 1 to 4

Table 1 shows production conditions for piezoelectric ceramics of Comparative Examples 1 to 4. Comparative piezoelectric ceramics were produced as in Example 1 except for the conditions described in Table 1.

In Comparative Example 4, sintering of the piezoelectric ceramic was carried out by a resistance heating/two-step sintering technique involving causing the sintering temperature to overshoot to a temperature at least 40° C. higher than the sintering temperature. In particular, a temperature of 1320° C. was retained for 1 minute and then a temperature of 1150° C. was retained for 15 hours.

Table 2 shows analytic data regarding the composition, structure, and characteristics of the piezoelectric ceramics of Comparative Examples. The analytical procedures were the same as in Example 1. The manganese contents in the piezoelectric ceramics of Comparative Examples relative to the barium titanate component were as follows:
Comparative Example 1: 0.16 mass %
Comparative Example 2: 0.18 mass %
Comparative Example 3: 0.18 mass %
Comparative Example 4: 0 mass % (undetectable)

All piezoelectric ceramics of Comparative Examples were composed of crystals of a perovskite single phase mainly composed of barium titanate. Although the density of the piezoelectric ceramics of Comparative Examples 2 and 4 was satisfactory, i.e., 95% or more, the density of the piezoelectric ceramic of Comparative Example 1 was about 90% and the density of the piezoelectric ceramic of Comparative Example 3 was about 92%.

The size and state of the crystal grains of the piezoelectric ceramics were observed as in Example 1. The size of the crystal grains was uniform in all piezoelectric ceramics. In other words, since only one type of crystal grains were generally present, the sea-island structure was not formed by the crystal grains in the ceramics. The crystal grains of Comparative Examples 1, 2, and 4 had a tetragonal crystal structure with c/a of about 1.02. The crystal grains of Comparative Example 3 had a cubic crystal structure with c/a substantially equal to 1.

Evaluation of Piezoelectric Constant

Gold electrodes were formed on the front and rear sides of the disk-shaped ceramic described above by DC sputtering. The ceramic with the electrodes was cut into a rectangular solid-shaped ceramic 12 mm×3 mm×1 mm in size.

The rectangular solid-shaped ceramic was polarized in silicone oil. The oil temperature was 100° C., the polarization voltage was DC 1 kV, and the voltage application time was 15 minutes.

The piezoelectric constant was measured using the polarized rectangular solid-shaped ceramic. In particular, the dependency of the impedance of the ceramic sample on the frequency was measured with an impedance analyzer (trade name 4294A, product of Agilent). Then the piezoelectric constant $d_{31}$ (pm/V) was determined from the observed resonance frequency and antiresonance frequency. The piezoelectric constant $d_{31}$ is a negative number. The piezoelectric performance is high when the absolute value of the piezoelectric constant $d_{31}$ is large. The results are shown in Table 2.

Evaluation of Mechanical Strength

The mechanical strength was evaluated by a three-point bending test with a tension-compression tester (trade name TENSILON RTC-1250A, product of ORIENTEC Co. Ltd.). A rectangular solid-shaped ceramic 12 mm×3 mm×1 mm in size was used in the evaluation. No electrodes were formed and thus no polarization was performed. Table 2 shows the maximum stress observed when the stress applied to the rectangular solid-shaped ceramic sample is increased until the sample is broken. A sufficient mechanical strength for continuously driving a piezoelectric element is a maximum stress of 40 MPa or more.

The comparison between the piezoelectric ceramics of Examples and Comparative Examples in Table 2 shows that the piezoelectric ceramics of Examples are superior to those of Comparative Examples in terms of piezoelectricity and mechanical strength. Among Examples, Example 1 had the best characteristics.

Example 8

A liquid discharge head and ultrasonic motors shown in FIGS. 1A, 1B, 2A, and 2B were made by using the piezoelectric ceramic of Example 1. It was confirmed that the liquid discharge head discharged ink according to input electrical signals and that the ultrasonic motors turned according to application of the alternating voltage.

The piezoelectric ceramic according to embodiments of the present invention has good piezoelectric characteristics and mechanical strength and low impact on environment. Thus, the piezoelectric ceramic can be used in devices that widely use piezoelectric ceramics, such as liquid discharge heads, ultrasonic motors, and piezoelectric elements.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-272883 filed Nov. 30, 2009, which is hereby incorporated by reference herein in its entirety.

What is claimed is:

1. A method for making a piezoelectric ceramic, comprising:
    sintering a mixture at least containing barium titanate particles 1 containing 0.05 mass % or more and 2.0 mass % or less manganese on a metal basis and barium titanate particles 2 containing less than 0.04 mass % manganese on a metal basis,
    wherein the piezoelectric ceramic comprises:
        barium titanate; and
        0.04 mass % or more and 0.20 mass % or less manganese relative to barium titanate,
        wherein the piezoelectric ceramic is composed of crystal grains,
        the crystal grains include crystal grains A having an equivalent circular diameter of 30 µm or more and 300 µm or less and crystal grains B having an equivalent circular diameter of 0.5 µm or more and 3 µm or less, and
        the crystal grains A and the crystal grains B individually form aggregates and the aggregates of the crystal grains A and the aggregates of the crystal grains B form a sea-island structure.

2. The method according to claim 1, wherein the content of the barium titanate particles 1 in the mixture is 2 mass % or more and 90 mass % or less.

* * * * *